(12) United States Patent
Wei et al.

(10) Patent No.: US 7,342,991 B2
(45) Date of Patent: Mar. 11, 2008

(54) SHIFT REGISTER CIRCUIT

(75) Inventors: Chun-Ching Wei, Taipei (TW); Yang-En Wu, Taipei (TW); Wei-Cheng Lin, Wurih Township, Taichung County (TW)

(73) Assignee: AU Optronics Corp., Hsinchu (TW)

( * ) Notice: Subject to any disclaimer, the term of this patent is extended or adjusted under 35 U.S.C. 154(b) by 199 days.

(21) Appl. No.: 11/385,544

(22) Filed: Mar. 20, 2006

(65) Prior Publication Data
US 2007/0071158 A1 Mar. 29, 2007

(30) Foreign Application Priority Data
Sep. 29, 2005 (TW) .............................. 94133967 A

(51) Int. Cl.
*G11C 19/00* (2006.01)
(52) U.S. Cl. ............................. 377/64; 377/68; 377/74
(58) Field of Classification Search .................. 377/64, 377/68, 72–74, 77–79
See application file for complete search history.

(56) References Cited

U.S. PATENT DOCUMENTS

| 6,690,347 B2 * | 2/2004 | Jeon et al. .................. 345/100 |
| 7,027,550 B2 * | 4/2006 | Lin .............................. 377/64 |
| 2004/0234020 A1 * | 11/2004 | Yu .............................. 377/64 |

* cited by examiner

*Primary Examiner*—Tuan T Lam
(74) *Attorney, Agent, or Firm*—Thomas, Kayden, Horstemeyer & Risley

(57) ABSTRACT

A shift register without a feedback signal of a post-stage shift register utilizing a latch mechanism and a clock signal to control the voltage of an output of the shift register is provided. The shift register reduces the transistor size and the circuit layout area. The shift register also improves the issue the overlapping between two adjacent shift registers to reduce the after-image of a liquid crystal display.

13 Claims, 8 Drawing Sheets

SHIFT REGISTER CIRCUIT

BACKGROUND OF THE INVENTION

1. Field of the Invention

The invention relates to a shift register and more particularly to a shift register without a feedback signal from an output signal of a post-stage shift register.

2. Description of the Related Art

Liquid crystal displays (LCD) have become the major product of displays, and minimizing the size and the weight of the LCDs, to dispose the driving circuit on the substrate of the LCD has become a major technology focus. Take the TFT LCD for example, since the amorphous Si process is the main technology, the low electron mobility of amorphous Si limits the size of the element formed by the amorphous Si process, such as a thin film transistor (TFT). If the transistor formed by the amorphous Si process wants to receive a larger current, the width of the channel of the transistor increases, thus, the layout area increases.

FIG. 1 is a circuit diagram of a conventional amorphous Si shift register. To ensure that the output of the shift register rapidly charges and discharges, the charging transistor T4 and the discharging transistors T5 and T6 receive larger current, thus, the width of those transistors is about a thousand micro-meters, and thus occupy larger layout areas. Moreover, the conventional shift register utilizes an output signal of a post-stage shift register to pull down the output signal, and if the shift register is the last-stage shift register, the output signal thereof may not completely discharge, such as shown in the dotted frame 20 of the FIG. 2. FIG. 2 is a timing diagram of the amorphous Si shift register of the FIG. 1. In FIG. 2, curve 21, 23, 25 and 27 respectively represents the charging and the discharging of the (N−1)th stage shift register, Nth stage shift register, (N+1)th stage shift register, and (N+2)th stage shift register. In FIG. 2, the (N+2)th stage shift register is the last-stage shift register, thus, the output signal thereof does not completely discharge, as shown by dotted frame 20. Take the output signal of the (N−1)th stage shift register for example, the discharge time thereof is about 25 μs and when the output signal of the Nth stage shift register charges, the output signal of the (N−1)th stage shift register does not discharge completely, thus, an overlap occurs, and this causes the incorrect LCD output.

Therefore, an amorphous Si shift register circuit capable of reducing the layout area and reducing or eliminating overlapping is desirable.

BRIEF SUMMARY OF THE INVENTION

The invention provides an amorphous Si shift register without a feedback signal from an output signal of a post-stage shift register.

The invention provides a shift register capable of reducing the circuit layout area.

The invention provides a shift register circuit having a cascade of shift registers comprising the follow elements: a first transistor having a gate, a first source/drain and a second source/drain, wherein the gate and the first source/drain of the first transistor is coupled to an output signal of a pre-stage shift register; a second transistor having a gate, a first source/drain and a second source/drain, wherein the gate of the second transistor is coupled to the first source/drain of the first transistor, and the second source/drain of the second transistor is coupled to a low voltage level; a third transistor having a gate, a first source/drain and a second source/drain, wherein the gate of the third transistor is coupled to the first source/drain of the second transistor, the first source/drain of the third transistor is coupled to the second source/drain of the first transistor, and the second source/drain of the third transistor is coupled to the low voltage level; a fourth transistor having a gate, a first source/drain and a second source/drain, wherein the gate of the fourth transistor is coupled to the second source/drain of the first transistor, the first source/drain of the fourth transistor is coupled to a first clock signal, and the second source/drain of the fourth transistor is coupled to a first output; a sixth transistor having a gate, a first source/drain and a second source/drain, wherein the gate and the first source/drain of the sixth transistor is coupled to a high voltage level; a seventh transistor having a gate, a first source/drain and a second source/drain, wherein the first source/drain of the seventh transistor is coupled to the second source/drain of the sixth transistor, and the second source/drain of the seventh transistor is coupled to the low voltage level; an eighth transistor having a gate, a first source/drain and a second source/drain, wherein the gate and the first source/drain of the eighth transistor is coupled to the high voltage level; a ninth transistor having a gate, a first source/drain and a second source/drain, wherein the first source/drain of the ninth transistor is coupled to the second source/drain of the eighth transistor, the second source/drain of the ninth transistor is coupled to the low voltage level, and the gates of the seventh and ninth transistors are coupled to the first output.

The invention further provides a shift register circuit having a cascade of shift registers, comprising the following elements: a first transistor having a gate, a first source/drain and a second source/drain, wherein the gate and the first source/drain of the first transistor is coupled to an output signal of a pre-stage shift register; a second transistor having a gate, a first source/drain and a second source/drain, wherein the gate of the second transistor is coupled to the first source/drain of the first transistor, and the second source/drain of the second transistor is coupled to a low voltage level; a third transistor having a gate, a first source/drain and a second source/drain, wherein the gate of the third transistor is coupled to the first source/drain of the second transistor, the first source/drain of the third transistor is coupled to the second source/drain of the first transistor, and the second source/drain of the third transistor is coupled to the low voltage level; a fourth transistor having a gate, a first source/drain and a second source/drain, wherein the gate of the fourth transistor is coupled to the second source/drain of the first transistor, the first source/drain of the fourth transistor is coupled to a first clock signal, and the second source/drain of the fourth transistor is coupled to a first output; a fifth transistor having a gate, a first source/drain and a second source/drain, wherein the first source/drain of the fifth transistor is coupled to the first output, and the second source/drain of the fifth transistor is coupled to the low voltage level; a first inverting device having a input and an output, wherein the output of the first inverter is coupled to the gate of the third transistor, and the input of the first inverter is coupled to the first output; a second inverting device having a input and an output, wherein the output of the second inverter is coupled to the gate of the fifth transistor, and the input of the second inverter is coupled to the first output.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
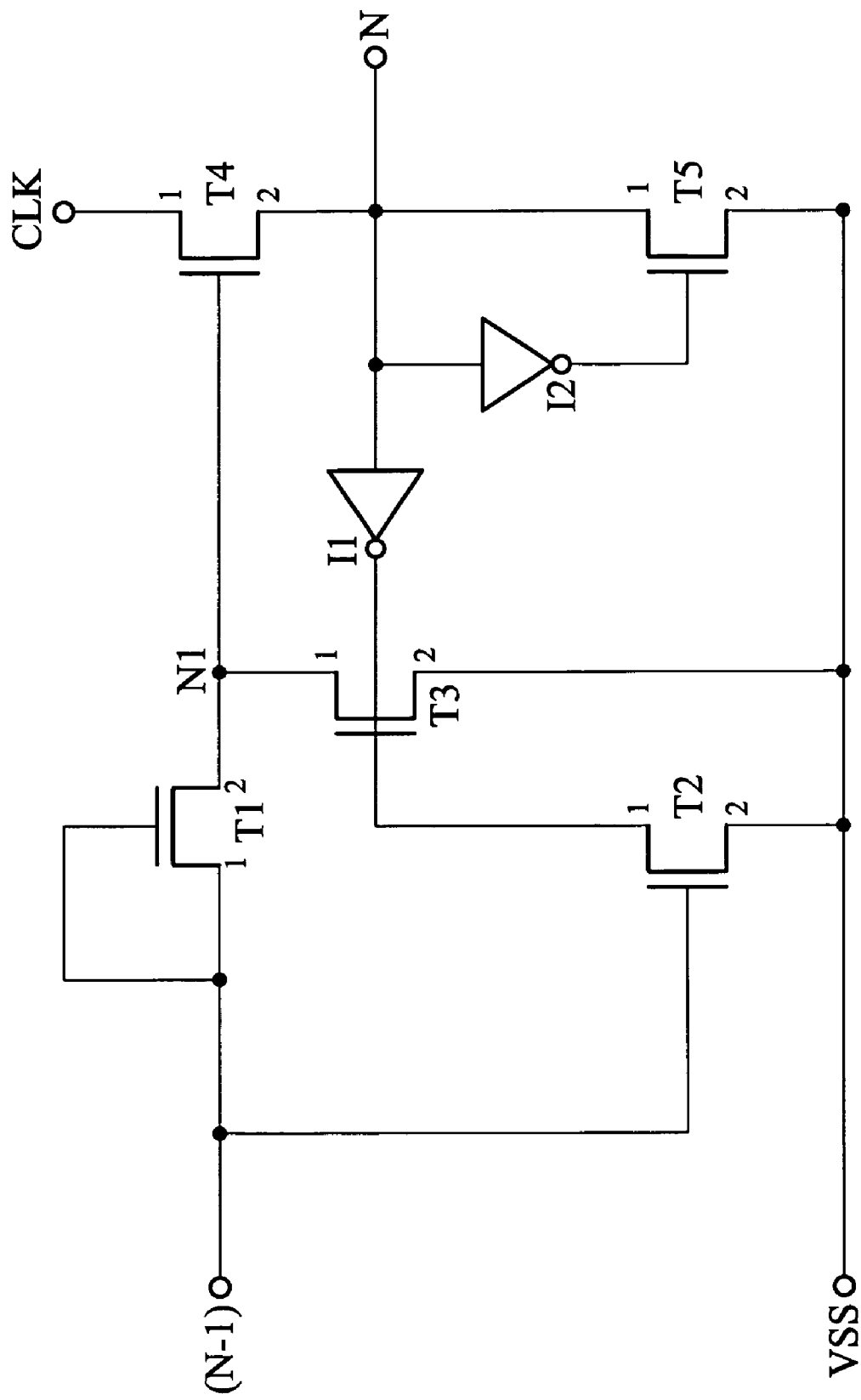
FIG. 3 is a circuit diagram of a shift register of an embodiment of the invention.

FIG. 3 is a circuit diagram of a shift register of an embodiment of the invention. The gate and first source/drain of transistor T1 is coupled to an output signal N−1 of a pre-stage, (N−1)th stage, shift register and the transistor T1 turns on when the output signal of the pre-stage shift register is at high voltage level. The second source/drain of transistor T1 is coupled to the gate of transistor T4. The first source/drain of transistor T4 is coupled to a clock signal CLK, and the second source/drain of transistor T4 is coupled to an output signal N of the Nth stage shift register. The gate of transistor T2 is coupled to the first source/drain of transistor T1, the second source/drain of transistor T2 is coupled to a low voltage level VSS, and the first source/drain of transistor T2 is coupled to the gate of transistor T3. The second source/drain of transistor T3 is coupled to the low voltage level VSS, and the first source/drain of transistor T3 is coupled to the first source/drain of transistor T1. An input of an inverting device I1 is coupled to the output signal N, and an output of the inverting device I1 is coupled to the gate of transistor T3. An input of an inverting device I2 is coupled to the output signal N and an output of the inverting device I2 is coupled to the gate of T5. The second source/drain of transistor T5 is coupled to the low voltage level VSS, and the first source/drain of transistor T5 is coupled to the output signal N.

When the output signal N−1 is at high voltage level, transistors T1 and T2 turn on and, then, the gate of transistor T3 is at low voltage level due to the switch-on of transistor T2. The gate of transistor T4 receiving a high voltage signal of the output signal N−1 turns on due to the switch-on of transistor T1. When the clock signal CLK is at high voltage level, the output signal N is at high voltage level, thus, voltage level of transistor T4 increases due to a coupling capacitor between the first source/drain and the gate of transistor T4. When the clock signal CLK is at the low voltage level, the output signal N is at the low voltage level. Transistors T3 and T5 turn on via the inverting devices I1 and I2 and the voltage of the gate of transistor T4 discharges via transistor T3 to the low voltage level, thus, transistor T4 turns off. The output signal N stays at the low voltage level due to the switch-on of transistor T5.

Figure 2:
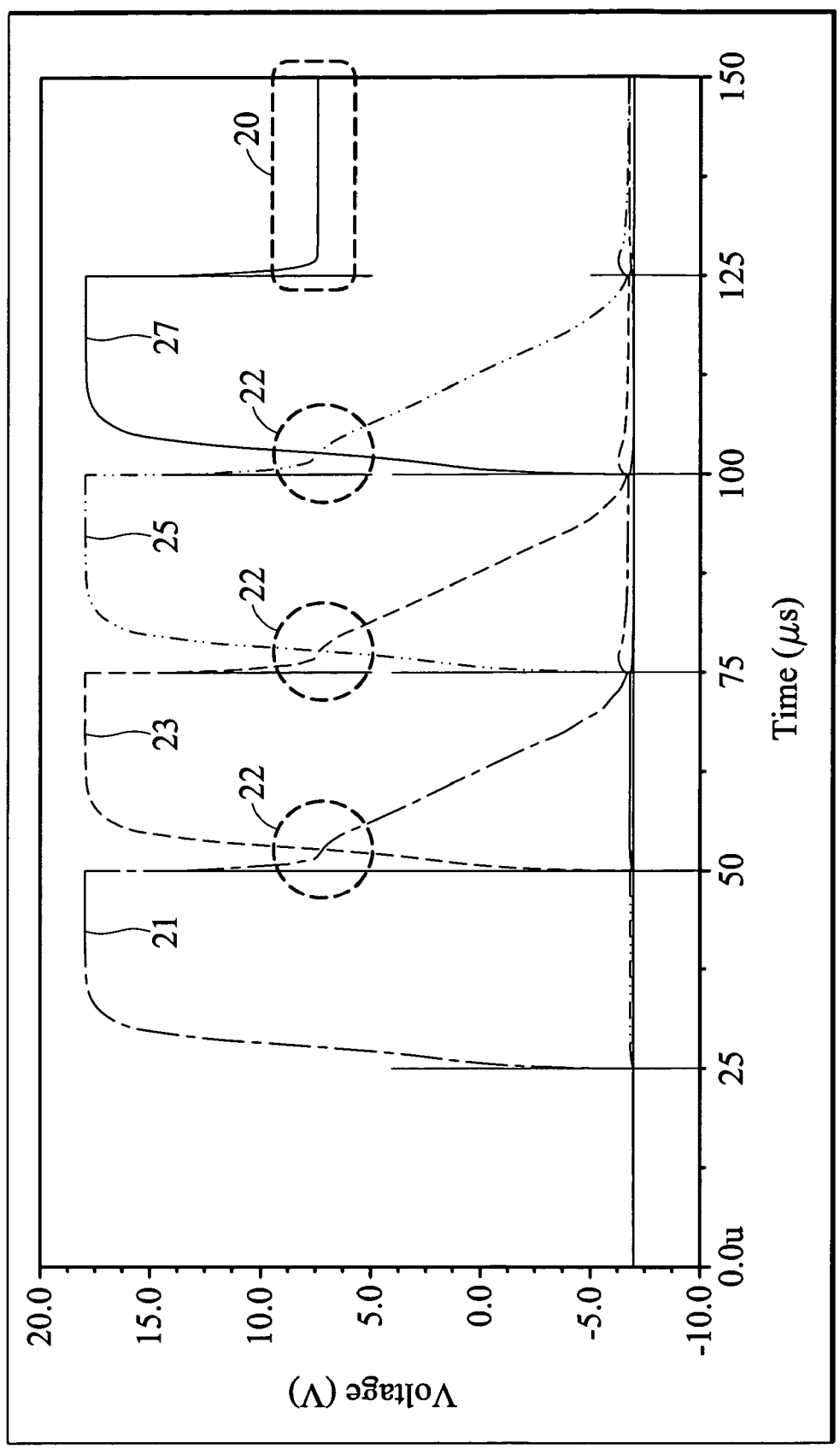
FIG. 2 is a timing diagram of the amorphous Si shift register of the FIG. 1.
Figure 4:
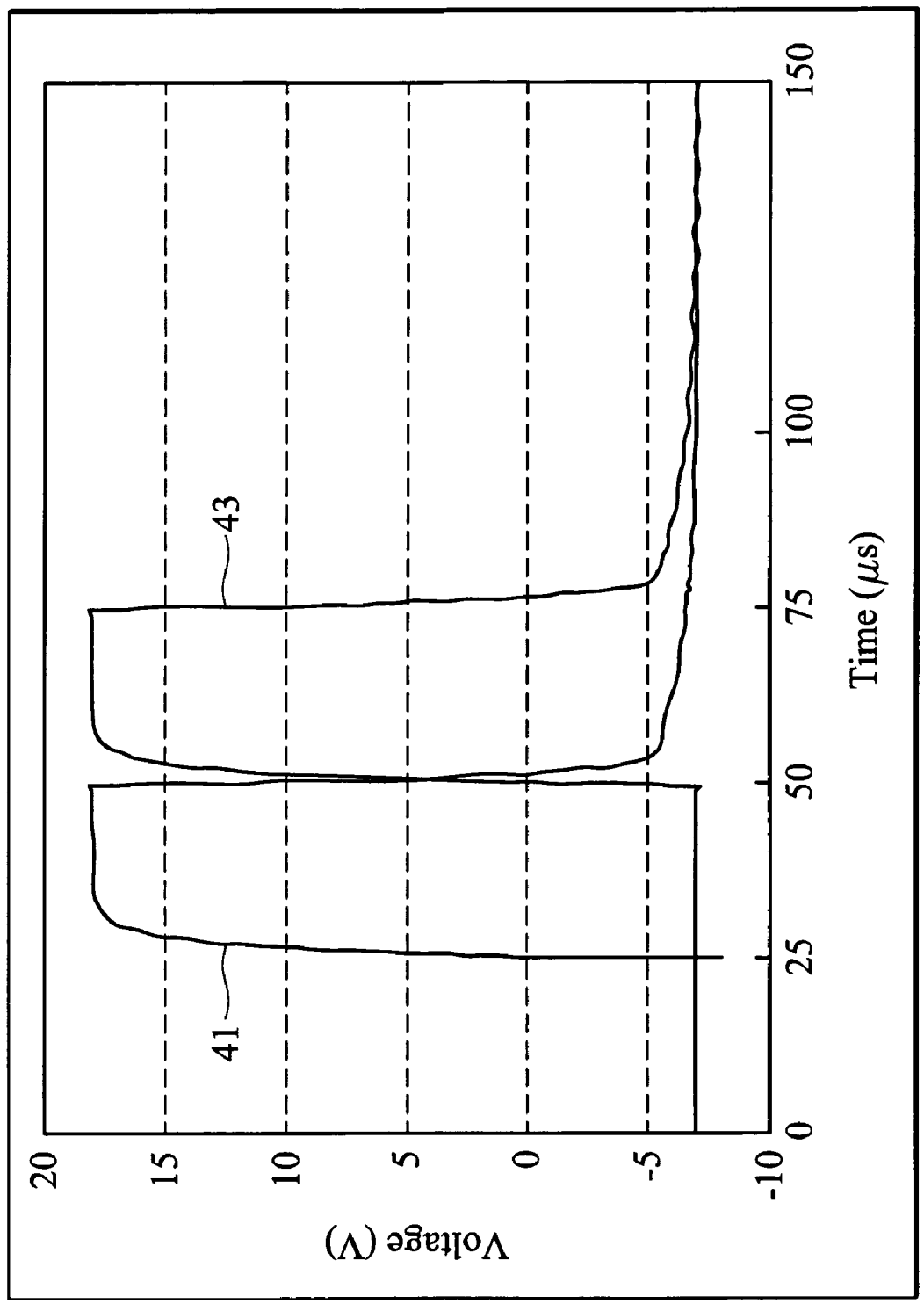
FIG. 4 is a schematic diagram of charging and discharging of the output of the shift register of FIG. 3.

Please refer to FIG. 4. FIG. 4 is a schematic diagram of charging and discharging of the output of the shift register of FIG. 3. Curve 41 is a charging and discharging curve of the output signal N−1 of the pre-stage shift register, and curve 43 is a charging and discharging curve of the output signal N. In FIG. 4, it is found that the shift register of the invention rapidly discharges and reduces an issue of uncompleted discharging, such as shown in the dotted frame 20 of FIG. 2. Moreover, the shift register of the invention has a shorter charging and discharging time to eliminate the issue of incomplete charging of the LCD.

Figure 5:
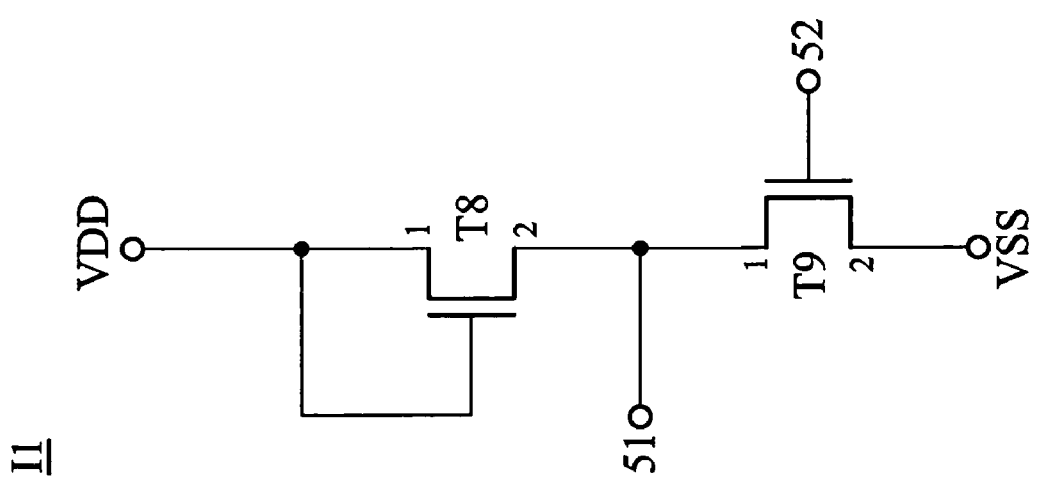
FIG. 5 is a circuit diagram of an embodiment of the inverting device I1 of FIG. 3.

The inverting devices I1 and I2 of FIG. 3 preferably are inverters. To further illustrate, the embodiments of the inverting devices I1 and I2 are provided. FIG. 5 is a circuit diagram of an embodiment of the inverting device I1 of FIG. 3. Node 51 coupling to the gate of transistor T3 is the output terminal of the inverting device I1. Node 52 coupling to the output signal N is the input terminal of the inverting device I2. The gate and the first source/drain of transistor T8 are coupled to the high voltage source VDD, and the second source/drain of transistor T8 is coupled to the node 51 and the first source/drain of transistor T9. The gate of transistor T9 is coupled to the node 52, and the second source/drain of transistor T9 is coupled to a low voltage source VSS. When the output signal N is at high voltage level, the transistor T9 turns on, thus, the node 51 is at low voltage level. When the output signal N is at low voltage level, the transistor T9 turns off, and the node is at high voltage level due to the switch-on of the transistor T8.

Figure 6:
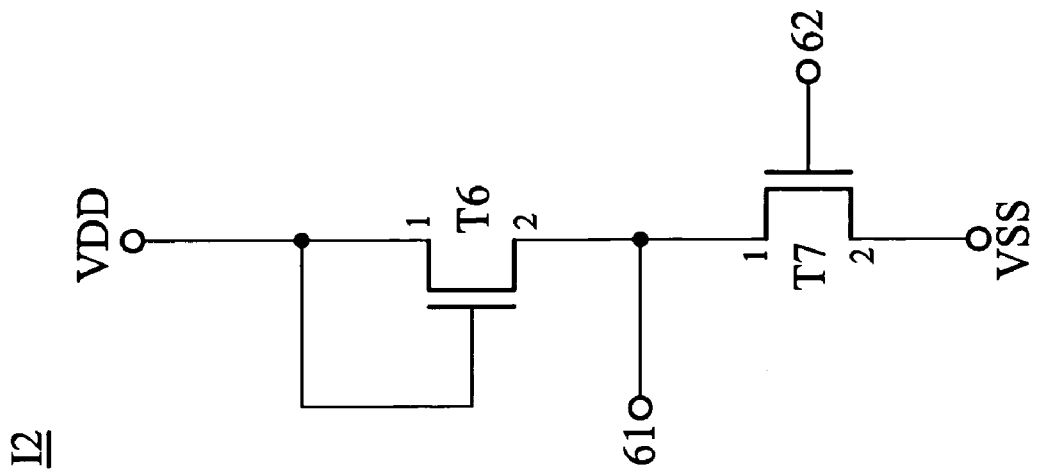
FIG. 6 is a circuit diagram of an embodiment of the inverting device I2 of FIG. 3.

FIG. 6 is a circuit diagram of an embodiment of the inverting device I2 of FIG. 3. Node 61 coupling to the gate of transistor T5 is the output terminal of the inverting device I2. Node 62 coupling to the output signal N is the input terminal of the inverting device I2. The gate and first source/drain of transistor T6 are coupled to VDD, and the second source/drain of transistor T6 is coupled to the first source/drain of transistor T7. The gate of transistor T7 is coupled to the node 62, and the second source/drain of transistor T7 is coupled to VSS. When the output signal N is at high voltage level, the transistor T7 turns on, thus, the node 61 is at low voltage level. When the output signal N is at low voltage level, the transistor T7 turns off, and the node is at high voltage level due to the switch-on of the transistor T6.

Figure 7:
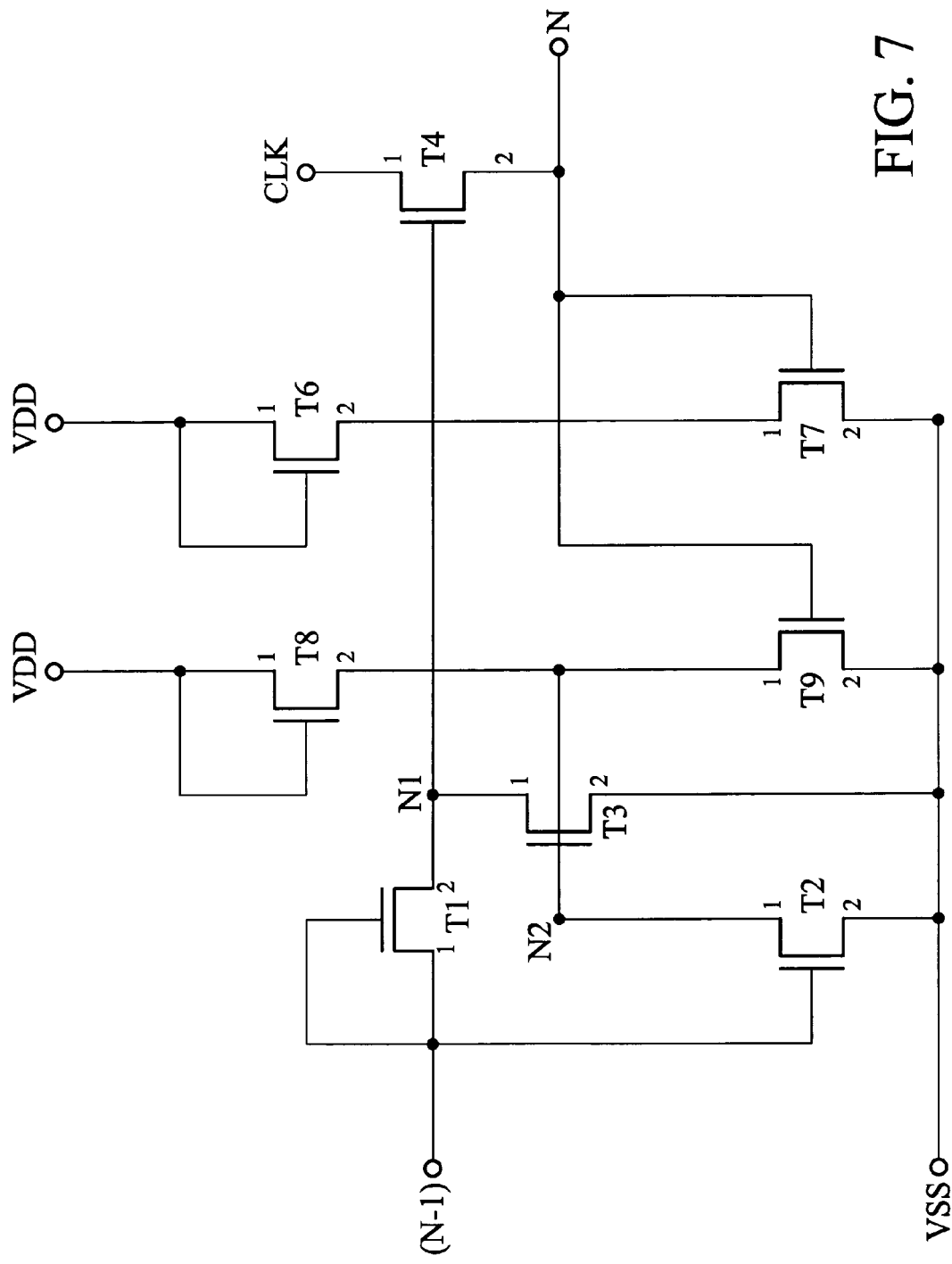
FIG. 7 is a circuit diagram of another embodiment of the shift register of the invention.

FIG. 7 is a circuit diagram of another embodiment of the shift register of the invention. The gate and the first source/drain of the first transistor T1 is coupled to the output signal N−1 of the pre-stage shift register. The gate of the second transistor T2 is coupled to the second source/drain of the first transistor T1, and the second source/drain of the second transistor T2 is coupled to a low voltage source VSS. The gate of the third transistor is coupled to the second source/drain of the second transistor T2, the first source/drain of the third transistor T3 is coupled to the second source/drain of the first transistor T1, and the second source/drain of the third transistor T3 is coupled to VSS. The gate of the fourth transistor T4 is coupled to the second source/drain of the first transistor T1, the first source/drain of the fourth transistor T4 is coupled to a first clock signal CLK, and the second source/drain of the fourth transistor T4 is coupled to the output signal N. The first source/drain of the fifth transistor T5 is coupled to the output signal N, the second source/drain of the fifth transistor T5 is coupled to VSS, and the gate of the fifth transistor T5 is coupled to the first source/drain of the seventh transistor T7. The first source/drain and the gate of the sixth transistor T6 are coupled to a high voltage source VDD. The first source/drain of the seventh transistor T7 is coupled to the second source/drain of the sixth transistor T6, and the second source/drain of the seventh transistor T7 is coupled to a low voltage source VSS. The gate and the first source/drain of the eighth transistor T8 is coupled to VDD. The first source/drain of the ninth transistor T9 is coupled to the second source/drain of the eighth transistor T8 and the first source/drain of the second transistor T2, the second source/drain of the ninth transistor T9 is coupled to VSS, and the gates of the ninth transistor T9 and the seventh transistor are coupled to the output signal N.

Figure 8:
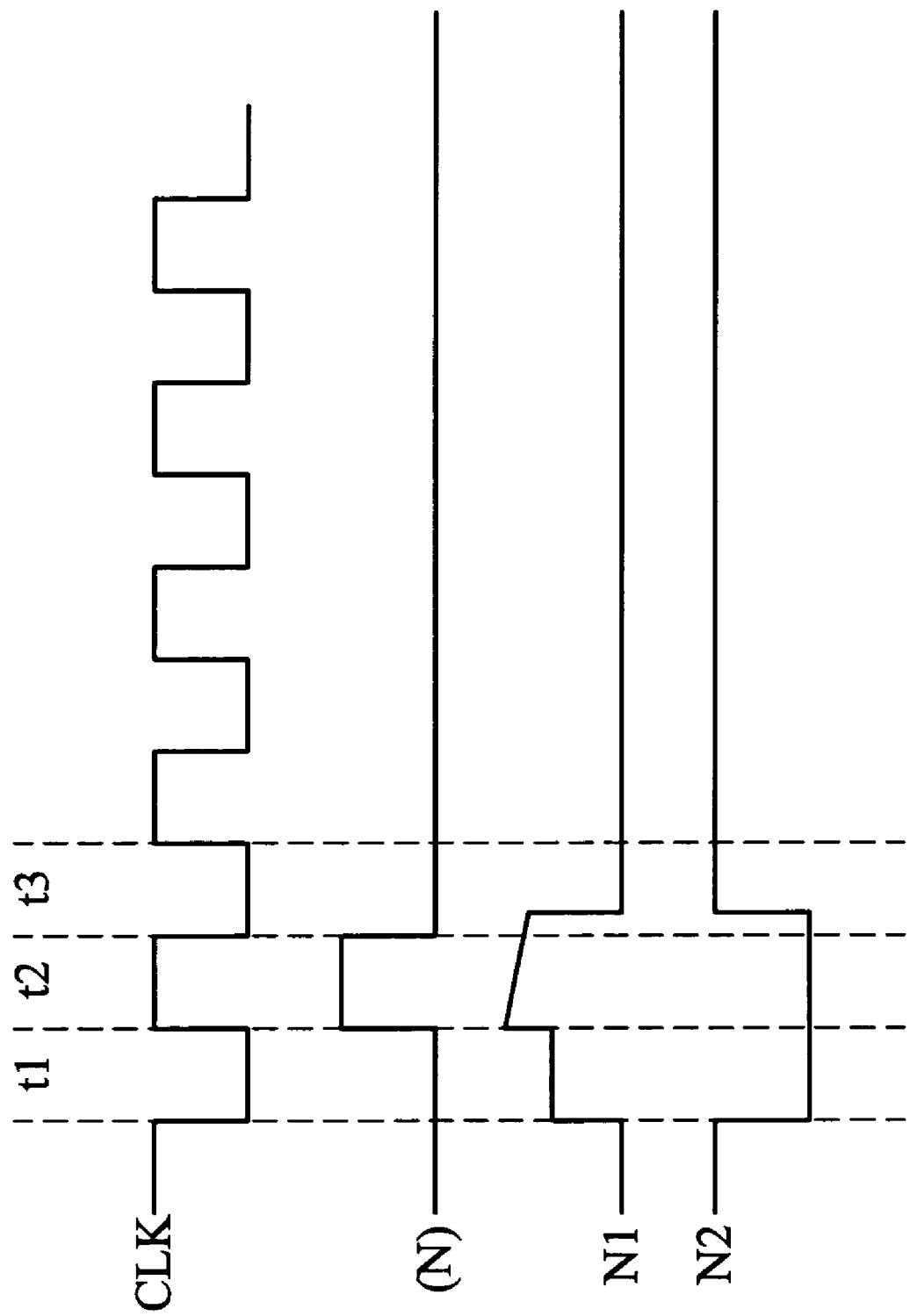
FIG. 8 is a waveform of the circuit of FIG. 7.

To further illustrate the operation of the circuit of FIG. 7, please refer to FIG. 8. FIG. 8 is a waveform of the circuit of FIG. 7. At time t1, the output signal N−1 of the pre-stage shift register is at high voltage level, thus, the first transistor T1 turns on and the node N1 is at high voltage level. The second transistor T2 turns on due to the high voltage level of the node N1, thus, the node N2 is coupled to the low voltage source VSS. At time t2, the output signal N−1 is at low voltage level, thus, the first transistor T1 and the ninth transistor T9 turn off. The voltage level of node N1 maintains in the high voltage level because of no discharging path, thus, the fourth transistor T4 is still on. Although the ninth transistor T9 turns, the node N2 is still at low voltage level. When the first clock signal CLK is at the high voltage level in time t2, the output signal N is at the high voltage level and this causes a charging of a coupling capacitor formed between the first source/drain and the gate of the fourth transistor T4, thus, the voltage level of node N1 increases. At time t3, the first clock signal CLK is at the low voltage level, thus, the output signal N is coupled to the low voltage VSS due to the switch-on of the transistor T4. The seventh transistor T7 turns off due to the low voltage level of the output signal N, and the sixth transistor T6 turns on due to the high voltage level of the node N2 to turn on the eighth transistor T8, thus, the voltage level of the node N1 discharges through the eighth transistor T8 and the fourth transistor T4 turns off.

Figure 9:
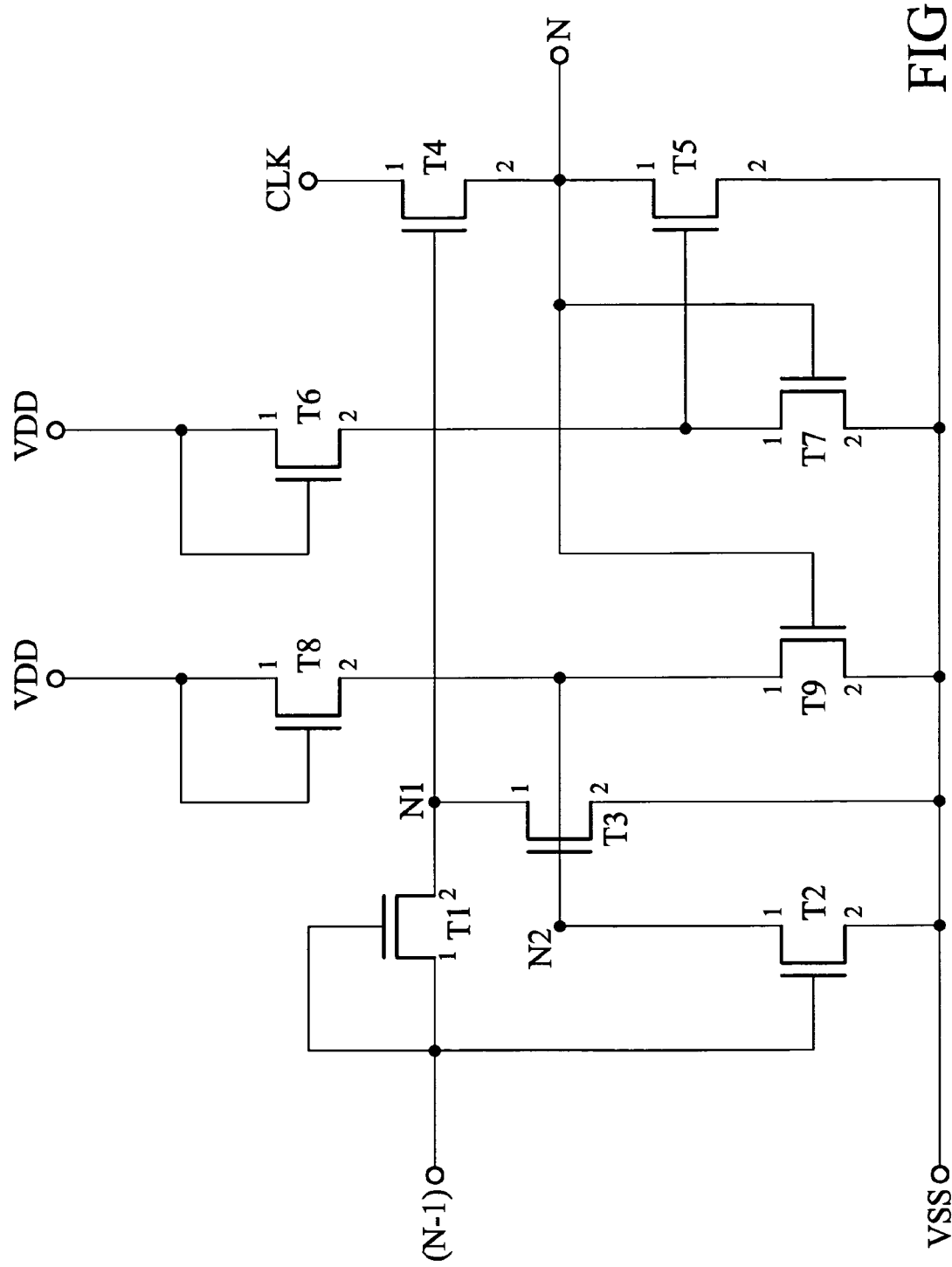
FIG. 9 is a circuit diagram of another embodiment of the shift register of the invention.

It is found that the shift register of FIG. 7 pulls down the voltage level of the output signal N to the low voltage level without the output signal of the next-stage shift register according to the waveform of FIG. 8. To ensure that the output signal N is pulled down to the low voltage level VSS, a fifth transistor T5 is added to the circuit of FIG. 7. Please refer to the FIG. 9. FIG. 9 is a circuit diagram of another embodiment of the invention. When the fourth transistor T4 turns on and the first clock signal is at the low voltage level, the output signal N is at the low voltage level, and the seventh transistor T7 turns off, thus, the fifth transistor T5 turns on and then the output signal N is coupled to the low voltage level VSS through the fifth transistor T5.

Figure 1:
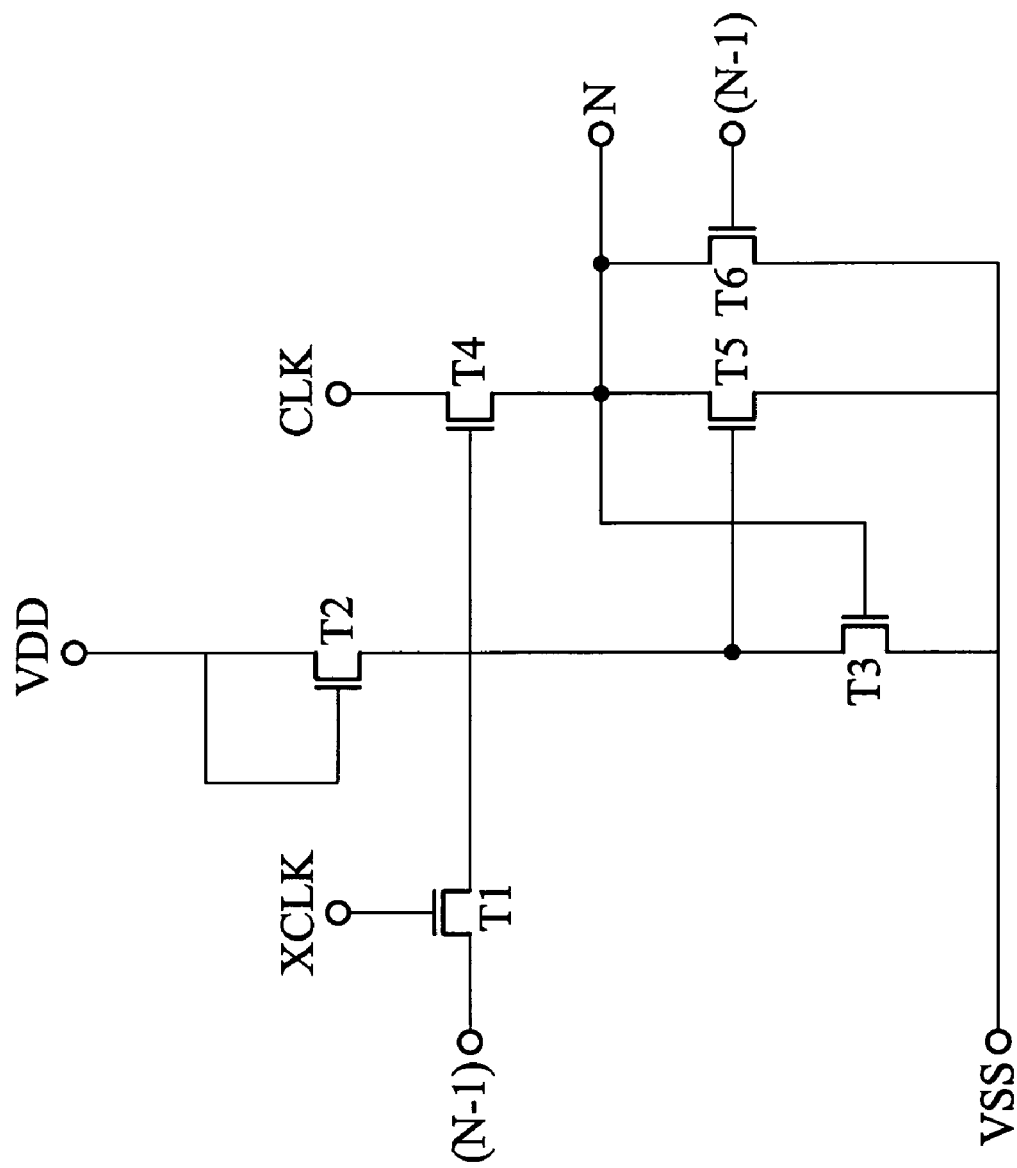
FIG. 1 is a circuit diagram of a conventional amorphous Si shift register.

Moreover, the shift register of the invention reduces the size of the layout areas. In a conventional shift register, such as the shift register of the FIG. 1, transistors T1, T4, T5 and T6 are the uses of charging and discharging, thus, the W/L values are at the range between hundreds of micro-meters and thousands of micro-meters, and the W/L values of transistors T2 and T3 are about hundreds of micro meters. In the shift register of the FIG. 7, the layout areas are reduced even though the numbers of transistors is increased, and the layout areas of the shift register of FIG. 7 are smaller than the layout areas of the shift register of FIG. 2.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A shift register circuit having a cascade of shift registers, comprising:
   a first transistor having a gate, a first source/drain and a second source/drain, wherein the gate and the first source/drain of the first transistor are coupled to an output signal of a pre-stage shift register;
   a second transistor having a gate, a first source/drain and a second source/drain, wherein the gate of the second transistor is coupled to the first source/drain of the first transistor, and the second source/drain of the second transistor is coupled to a low voltage level;
   a third transistor having a gate, a first source/drain and a second source/drain, wherein the gate of the third transistor is coupled to the first source/drain of the second transistor, the first source/drain of the third transistor is coupled to the second source/drain of the first transistor, and the second source/drain of the third transistor is coupled to the low voltage level;
   a fourth transistor having a gate, a first source/drain and a second source/drain, wherein the gate of the fourth transistor is coupled to the second source/drain of the first transistor, the first source/drain of the fourth transistor is coupled to a first clock signal, and the second source/drain of the fourth transistor is coupled to a first output;
   a sixth transistor having a gate, a first source/drain and a second source/drain, wherein the gate and the first source/drain of the sixth transistor are coupled to a high voltage level;
   a seventh transistor having a gate, a first source/drain and a second source/drain, wherein the first source/drain of the seventh transistor is coupled to the second source/drain of the sixth transistor, and the second source/drain of the seventh transistor is coupled to the low voltage level;
   a eighth transistor having a gate, a first source/drain and a second source/drain, wherein the gate and the first source/drain of the eighth transistor is coupled to the high voltage level; and
   a ninth transistor having a gate, a first source/drain and a second source/drain, wherein the first source/drain of the ninth transistor is coupled to the second source/drain of the eighth transistor, the second source/drain of the ninth transistor is coupled to the low voltage level, and the gates of the seventh and ninth transistors are coupled to the first output.

2. The circuit as claimed in claim 1, further comprising a fifth transistor having a gate, a first source/drain and a second source/drain, wherein the first source/drain of the fifth transistor is coupled to the first output, the second source/drain of the fifth transistor is coupled to the low voltage level, and the gate of the fifth transistor is coupled to the first source/drain of the seventh transistor.

3. The circuit as claimed in claim 1, wherein the output signal of the pre-stage shift register is a start pulse when the shift register is a first shift register.

4. The circuit as claimed in claim 1, wherein at least one of the transistors is an NMOS transistor.

5. The circuit as claimed in claim 1, wherein all of the transistors are thin film transistors disposed on a glass substrate.

6. A shift registers circuit having a cascade of shift registers, comprising:
   a first transistor having a gate, a first source/drain and a second source/drain, wherein the gate and the first source/drain of the first transistor are coupled to an output signal of a pre-stage shift register;
   a second transistor having a gate, a first source/drain and a second source/drain, wherein the gate of the second transistor is coupled to the first source/drain of the first transistor, and the second source/drain of the second transistor is coupled to a low voltage level;
   a third transistor having a gate, a first source/drain and a second source/drain, wherein the gate of the third transistor is coupled to the first source/drain of the second transistor, the first source/drain of the third transistor is coupled to the second source/drain of the first transistor, and the second source/drain of the third transistor is coupled to the low voltage level;
   a fourth transistor having a gate, a first source/drain and a second source/drain, wherein the gate of the fourth transistor is coupled to the second source/drain of the first transistor, the first source/drain of the fourth transistor is coupled to a first clock signal, and the second source/drain of the fourth transistor is coupled to a first output;
   a fifth transistor having a gate, a first source/drain and a second source/drain, wherein the first source/drain of the fifth transistor is coupled to the first output, and the second source/drain of the fifth transistor is coupled to the low voltage level;
   a first inverting device having a input and an output, wherein the output of the first inverting device is coupled to the gate of the third transistor, and the input of the first inverting device is coupled to the first output; and
   a second inverting device having an input and an output, wherein the output of the second inverting device is coupled to the gate of the fifth transistor, and the input of the second inverting device is coupled to the first output.

7. The circuit as claimed in claim 6, wherein the first inverting device is an inverter.

8. The circuit as claimed in claim 6, wherein the second inverting device is an inverter.

9. The circuit as claimed in claim 6, wherein the first inverting device comprises:
   a eighth transistor having a gate, a first source/drain and a second source/drain, wherein the gate and the first source/drain of the eighth transistor are coupled to a power source; and
   a ninth transistor having a gate, a first source/drain and a second source/drain, wherein the first source/drain of the ninth transistor and the second source/drain of the eighth transistor are coupled to the output of the first inverter, the second source/drain of the ninth transistor is coupled to the low voltage level, and the gate of the ninth transistor is coupled to the input of the first inverter.

10. The circuit as claimed in claim 6, wherein the second inverting device comprises:
    a sixth transistor having a gate, a first source/drain and a second source/drain, wherein the gate and the first source/drain of the sixth transistor are coupled to a power source; and
    a seventh transistor having a gate, a first source/drain and a second source/drain, wherein the first source/drain of the seventh transistor and the second source/drain of the sixth transistor are coupled to the output of the second inverting device, the second source/drain of the seventh transistor is coupled to the low voltage level, and the gate of the seventh transistor is coupled to the input of the second inverter.

11. The circuit as claimed in claim 6, wherein at least one of the transistors is an NMOS transistors.

12. The circuit as claimed in claim 6, wherein all of the transistors are thin film transistors disposed on a glass substrate.

13. The circuit as claimed in claim 6, wherein the output signal of the pre-stage shift register is a start pulse when the shift register is a first shift register.

* * * * *